United States Patent
Choi et al.

(10) Patent No.: US 8,283,976 B2
(45) Date of Patent: Oct. 9, 2012

(54) SWITCHING DEVICE OF DIGITAL AMPLIFIER AND METHOD FOR DRIVING THE SAME

(75) Inventors: Yeongha Choi, Anyang-si (KR); Minsoo Kim, Gwangmyeong-si (KR); Sungil Kim, Seoul (KR); Seokil Jeong, Seoul (KR)

(73) Assignee: Neofidelity, Inc., Seoul (KR)

( * ) Notice: Subject to any disclaimer, the term of this patent is extended or adjusted under 35 U.S.C. 154(b) by 1 day.

(21) Appl. No.: 13/014,082

(22) Filed: Jan. 26, 2011

(65) Prior Publication Data
US 2011/0181356 A1 Jul. 28, 2011

(30) Foreign Application Priority Data

Jan. 27, 2010 (KR) .................. 10-2010-0007404
Aug. 13, 2010 (KR) .................. 10-2010-0078207

(51) Int. Cl.
H03F 3/38 (2006.01)
(52) U.S. Cl. .......................................... 330/10
(58) Field of Classification Search .................. 330/10; 332/109; 375/238
See application file for complete search history.

(56) References Cited

U.S. PATENT DOCUMENTS 7,724,082 B2 * 5/2010 Park et al. .................. 330/10
* cited by examiner

*Primary Examiner* — Steven J Mottola
(74) *Attorney, Agent, or Firm* — Stein McEwen, LLP

(57) ABSTRACT

A switching device of a digital amplifier and a method for controlling the same are disclosed. In accordance with the present invention, a linearity is maintain even for a short pulse width since a data signal having a pulse width shorter than a predetermined length. Moreover, when an MLP signal is located at both sides of a compensating signal without overlapping with each other, a problem due to a common mode may be prevented.

14 Claims, 19 Drawing Sheets

<Prior Art>

<Prior Art>

<Prior Art>

SWITCHING DEVICE OF DIGITAL AMPLIFIER AND METHOD FOR DRIVING THE SAME

CROSS-REFERENCE TO RELATED APPLICATIONS

This application claims the benefit of Korean Patent Applications No. 10-2010-0007404 filed on Jan. 27, 2010 and 10-2010-0078207 filed on Oct. 13, 2010, which are hereby incorporated by reference.

BACKGROUND OF THE INVENTION

1. Field of the Invention

The present invention relates to a switching device of a digital amplifier and a method for controlling the same, and more particularly to a switching device of a digital amplifier and a method for controlling the same wherein a distortion occurring in a digital amplifier due to a pulse width of a PWM signal may be prevented using an MLP signal and a compensating signal.

2. Description of the Related Art

A digital amplifier also known as class D amplifier transmits an electric power by switching transistors. Since the digital amplifier is not only highly efficient but also does not need a heat sink, the digital amplifier may be easily miniaturized.

FIG. 1 is block diagram exemplifying a conventional digital amplifier.

Referring to FIG. 1, a PCM (Pulse Code Modulation) signal is converted to a PWM (Pulse Width Modulation) signal by a PWM converter 20. As shown in FIG. 2, the PWM signal has a pulse width corresponding to the amplitude of an analog signal. The PWM signal shown in FIG. 2 is a BD modulated PWM signal which has a value of +1, a value of zero or a value of −1 according to the amplitude of the analog signal.

The PWM signal is applied to and drives a switch module 30. When the PWM signal has the value of +1, the PWM converter 20 outputs a logical high as a signal P and a logical low as a signal N. On the contrary, when the PWM signal has the value of −1, the PWM converter 20 outputs the logical low as the signal P and the logical high as the signal N. When the PWM signal has the value of zero, the PWM converter 20 outputs the logical low as the signal P and the logical low as the signal N.

A signal A and a signal B outputted by the switch module 30 driven by the signal P and the signal N are passed through a low-pass filter 40 to be applied to a speaker 50. A difference between the signal A and the signal B, i.e., VDD, zero or −VDD is applied to the low-pass filter 40.

The switch module 30 is composed of semiconductors. Particularly, as shown in FIG. 1, the switch module 30 may be embodied using the plurality of semiconductors.

The semiconductors included in the switch module 30 perform switching operations according to a signal applied to a gate of the semiconductors. When the pulse width of the PWM signal applied to the gate of the semiconductors is sufficiently long, i.e., when the pulse width of the PWM signal is sufficiently longer than a switching time of the semiconductors, the semiconductors perform the switching operations normally. However, when the pulse width of the PWM signal is shorter than a predetermined length, the semiconductors cannot perform the switching operations normally resulting in a distortion of an output signal of the switch module 30.

Particularly, since the pulse width of the PWM signal is very short about a zero-crossing (shown in FIG. 2 as dotted line) of the analog signal, the distortion may occur in the output signal of the switch module 30. Therefore, a sound quality of audio signal outputted by the speaker 50 may be degraded.

SUMMARY OF THE INVENTION

It is an object of the present invention to provide a switching device of a digital amplifier and a method for controlling the same wherein a distortion occurring in a digital amplifier due to a pulse width of a PWM signal may be prevented using an MLP signal and a compensating signal.

In order to achieve above-described object of the present invention, there is provided a switching device for driving a load according to a data signal included in a frame of a PWM signal, comprising: a controller for outputting an MLP signal; and a compensating signal when [data]≦[MPC] is satisfied, wherein a pulse width of the compensating signal is sum of [data] and [MLP]; and a switch module for performing a switching operation according to the MLP signal and the compensating signal (where [MLP] is a pulse width of a reference pulse, [data] and [MPC] are pulse widths of the data signal and the MLP signal, respectively).

Preferably, [MPC] satisfies ([MLP]+[MPC])≦(a length of the frame−[MPW]) (where [MPW] is a minimum pulse width).

Preferably, the MLP signal and the compensating signal are located within the frame, and overlap with each other with respect to a time axis.

Preferably, the MLP signal and the compensating signal are located within the frame, and not overlapping with each other with respect to a time axis.

Preferably, an interval between the MLP signal and the compensating signal is zero.

Preferably, an interval between the MLP signal and the compensating signal is non-zero.

Preferably, the MLP signal is located before and after the compensating signal with each other with respect to the time axis.

There is also provided a switching device for driving a load according to a data signal included in a frame of a PWM signal, comprising: a controller for outputting an MLP signal; and a first compensating signal when [data]≦[MPC] is satisfied, wherein a pulse width of the first compensating signal is sum of [data] and [MLP], a second compensating signal; and a third compensation signal when [MPC]<[data]≦([MPC]+[MLP]) is satisfied, wherein a pulse width of the second compensation signal is a sum of [MPC] and [MLP], and a pulse width of the third compensation is [MLP]−([data]−[MPC]); and a switch module for performing a switching operation according to the MLP signal, the first compensating signal, the second compensating signal and the third compensating signal (where [MLP] is a pulse width of a reference pulse, [data] and [MPC] are pulse widths of the data signal and the MLP signal, respectively).

Preferably, [MPC] is satisfied [MLP]+[MPC]≦(a length of the frame−[MPW]) (where [MPW] is a minimum pulse width).

Preferably, the MLP signal, each of the first compensating signal, the second compensating signal and the third compensating signal is located within the frame, and overlaps with each other with respect to a time axis.

Preferably, each of the first compensating signal, the second compensating signal and the third compensating signal is located within the frame, and not overlapping with each other with respect to a time axis.

Preferably, intervals between the MLP signal and the first compensating signal, and the second compensating signal and the third compensation signal are zero, respectively.

Preferably, intervals between the MLP signal and the first compensating signal, and the second compensating signal and the third compensation signal are non-zero, respectively.

Preferably, the MLP signal is located before and after the first compensating signal with each other with respect to the time axis.

In order to achieve above-described object of the present invention, there is provided a method for driving a switching device driving a load according to a data signal included in a frame of a PWM signal, the method comprising steps of: (a) determining whether [data]≦[MPC] is satisfied; (b) outputting an MLP signal; and a compensating signal when [data]≦[MPC] is satisfied, wherein a pulse width of the compensating signal is sum of [data] and [MLP]; and (c) performing a switching operation by applying the MLP signal and the compensating signal outputted in the step (b) on a switch module.

Preferably, the MLP signal and the compensating signal are located within the frame, and overlap with each other with respect to a time axis.

Preferably, the MLP signal and the compensating signal are located within the frame, and not overlapping with each other with respect to a time axis.

Preferably, an interval between the MLP signal and the compensating signal is zero.

Preferably, an interval between the MLP signal and the compensating signal is non-zero.

Preferably, the MLP signal is located before and after the compensating signal with each other with respect to the time axis.

In order to achieve above-described object of the present invention, there is provided a method for driving a switching device driving a load according to a data signal included in a frame of a PWM signal, the method comprising steps of: (a) determining whether [data]≦[MPC] is satisfied; (b) outputting an MLP signal; and a first compensating signal when [data]≦[MPC] is satisfied, wherein a pulse width of the first compensating signal is sum of [data] and [MLP]; (c) performing a switching operation according to the MLP signal and the compensating signal outputted in the step (b); (d) determining whether [MPC]<[data]≦[MPC]+[MLP] is satisfied; (e) outputting a second compensating signal; and a third compensating signal when [MPC]<[data]≦[MPC]+[MLP] is satisfied, wherein a pulse width of the second compensating signal is sum of [MPC] and [MLP], and a pulse width of the third compensating signal is [MLP]−([data]−[MPC]); and (f) performing the switching operation according to the second compensating signal and the third compensating signal outputted in the step (e) (where [MLP] is a pulse width of a reference pulse, [data] and [MPC] are pulse widths of the data signal and the MLP signal, respectively).

Preferably, [MPC] satisfies ([MLP]+[MPC])≦(a length of the frame−[MPW]) (where [MPW] is minimum pulse width).

Preferably, each of the MLP signal, the first compensating signal, the second compensating signal and the third compensating signal is located within the frame, and overlaps with each other with respect to a time axis.

Preferably, each of the first compensating signal, the second compensating signal and the third compensating signal is located within the frame, and not overlapping with each other with respect to a time axis.

Preferably, intervals between the MLP signal and the first compensating signal and the second compensating signal and the third compensation signal are zero, respectively.

Preferably, intervals between the MLP signal and the first compensating signal and the second compensating signal and the third compensation signal are non-zero, respectively.

Preferably, the MLP signal is located before and after the first compensating signal with each other with respect to the time axis.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

A switching device of a digital amplifier and a method for controlling the same in accordance with the present invention will be described in detail with reference to accompanied drawings.

Definitions of terms used herein will be given prior to detailed description of the present invention.

1. [MLP] (Minimum Length of Linear Pulse)

Figure 3:
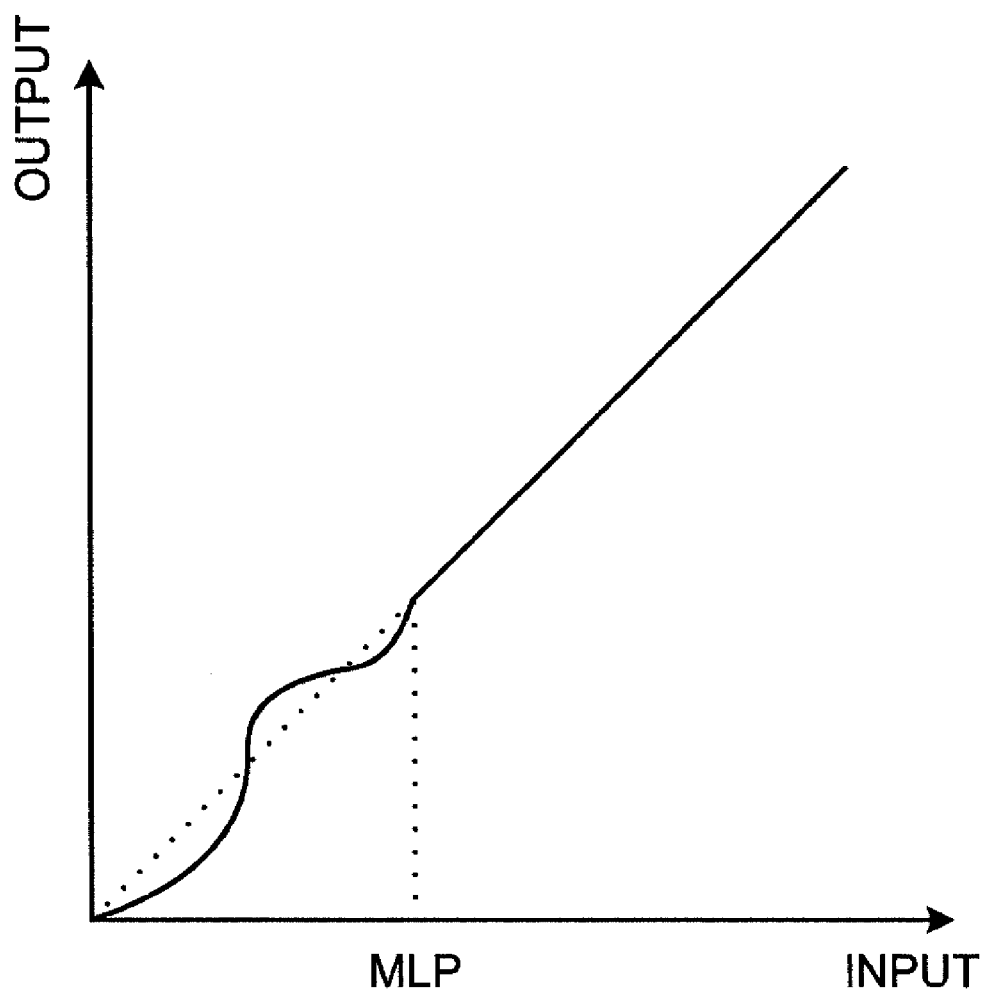
FIG. 3 is a graph exemplifying a conventional relationship between pulse widths of an input signal and an output signal in accordance with a prior art.

[MLP] is the minimum number of unit pulses that ensures linearity. As shown in FIG. 3, when a pulse width of an input pulse inputted in a switching module is greater than [MLP], a linear relationship is established between the pulse width inputted in the switching module and a pulse width of an output pulse outputted therefrom. When the pulse width inputted in the switching module is less than [MLP], a non-linear relationship is established between the pulse width inputted in the switching module and the pulse width outputted therefrom. That is, [MLP] is the minimum number of unit pulses for establishing the linear relationship between pulse widths of the input pulse and the output pulse.

2. MLP signal

An MLP signal is a pulse signal wherein a length of which is [MLP]. For instance, when [MLP]=3, the MLP signal has the length of 3 clocks.

3. [MPC] (Maximum Pulse to Compensate)

[MPC] is the number of unit pulses that determines whether to compensate or not, i.e., a reference pulse width. For instance, when [MPC]=120, the pulse which has the pulse width equal to or less than 120 clocks is compensated, and the pulse which has the pulse width greater than 120 clocks is not compensated.

4. [data]

[data] is a pulse width of a data signal included in a frame of a PWM signal.

A switching device in accordance with the present invention is described herein after in more detail with reference to FIG. 4.

Figure 4:
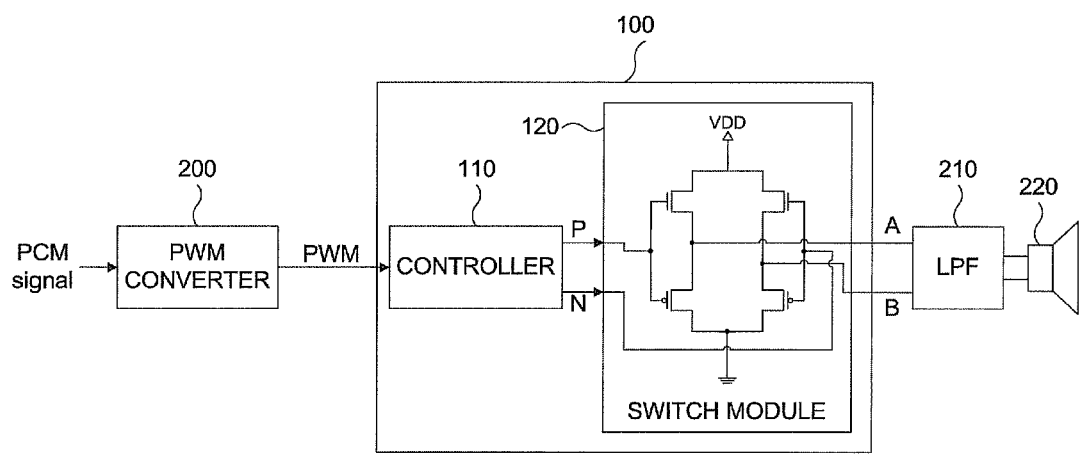
FIG. 4 is a block diagram exemplifying a switching device in accordance with the present invention.
Figure 4:
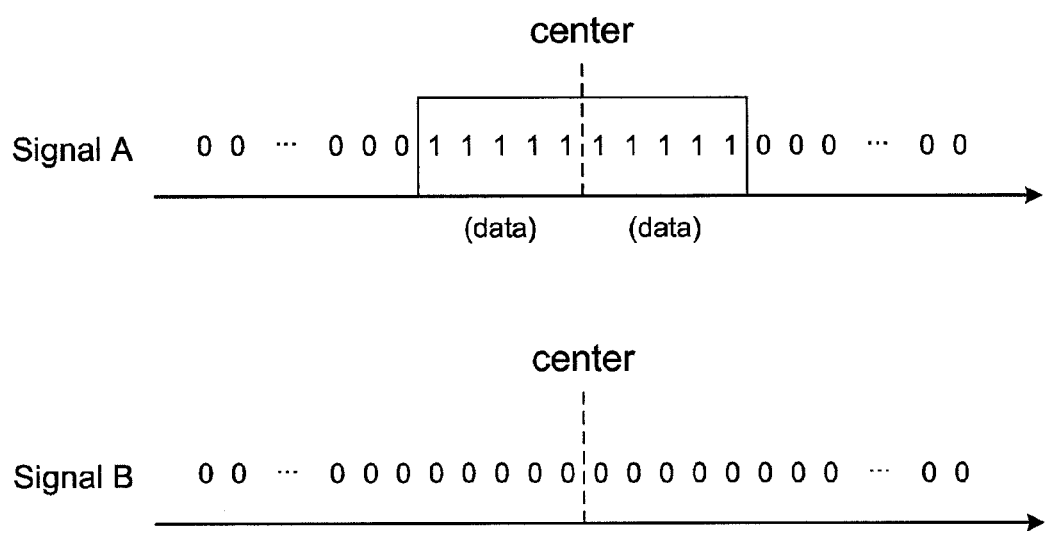

FIG. 4 is a block diagram exemplifying a switching device 100 in accordance with the present invention.

Referring to FIG. 4, the switching device 100 in accordance with the present invention comprises a controller 110 and a switch module 120.

The controller 110 receives a PWM signal from a PWM converter 200, which converts a PCM signal to the PWM signal. The controller 110 processes the PWM signal to generate a signal P and a signal N for driving the switch module 120.

The switch module 120 performs a switching operation according to the signal P and the signal N outputted from the controller 110. The switch module 120 outputs a signal A and a signal B as output signals. The signal A and the signal B is passed through a low-pass filter 210 to be drive a speaker 220.

Figure 1:
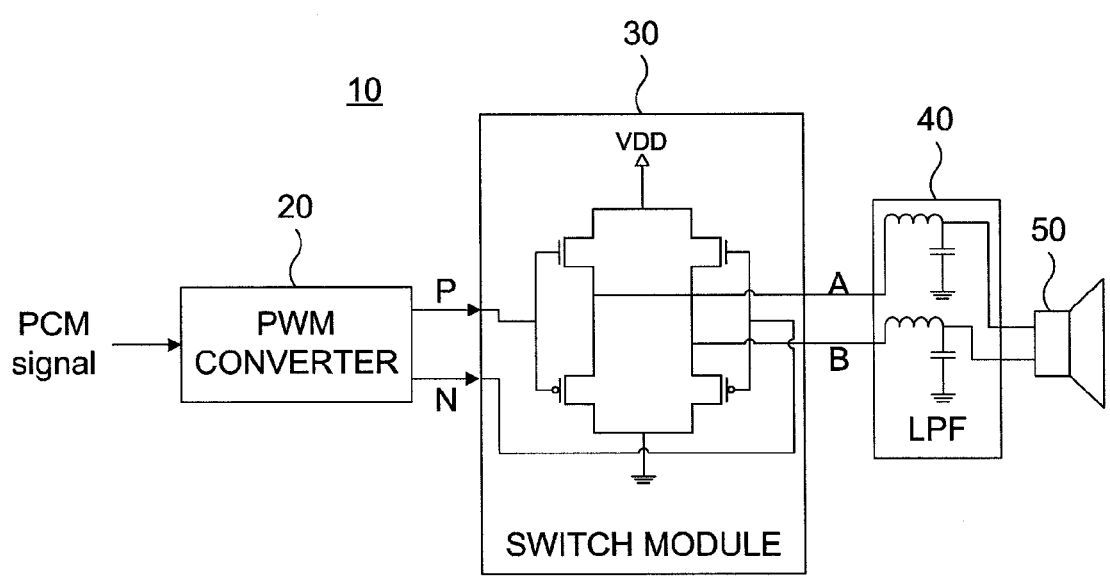
FIG. 1 is block diagram exemplifying a conventional digital amplifier.
Figure 2:
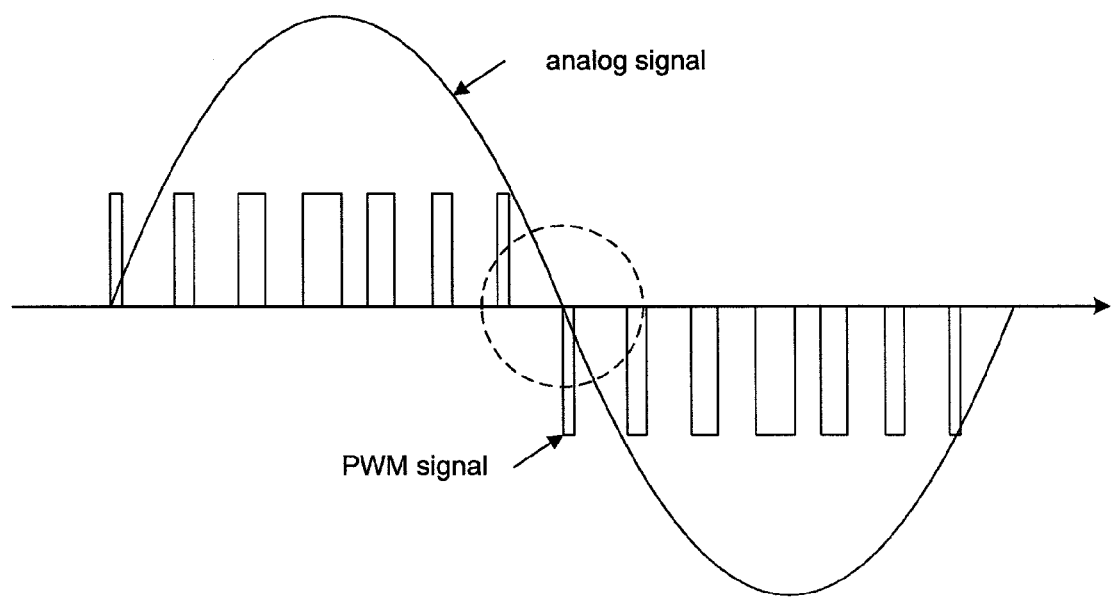
FIG. 2 is a graph exemplifying an analog signal and a PWM signal corresponding thereto.

The switch module 120 may comprise an H-bridge switch circuit as shown in FIG. 1.

A driving operation of the switch module 120 wherein the controller 110 processes the PWM signal to drive the switch module 120, and the signal A and the signal B as output signals of the switch module 120 are described hereinafter in more detail.

FIGS. 5a through 5d are graphs exemplifying a data signal, an MLP signal and a compensating signal in accordance with a first embodiment of the present invention, where [MLP]=3 and [MPC]=5.

Figure 5A:
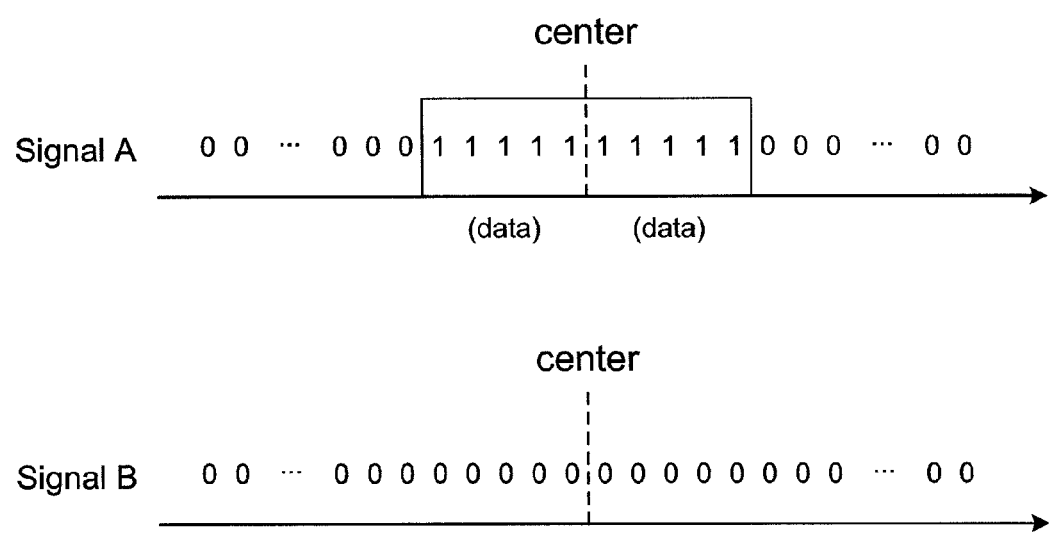
FIGS. 5a through 5d are graphs exemplifying a data signal, an MLP signal and a compensating signal in accordance with a first embodiment of the present invention.

FIG. 5a illustrates a graph wherein a case where the pulse width of the data signal included in the frame of the PWM signal is six, i.e., [data]=6, and the amplitude thereof is +1. Referring to FIG. 5a, since [data] is greater than [MPC] (=5), the controller 110 outputs the data signal as the signal A and zero as the signal B.

Figure 5B:
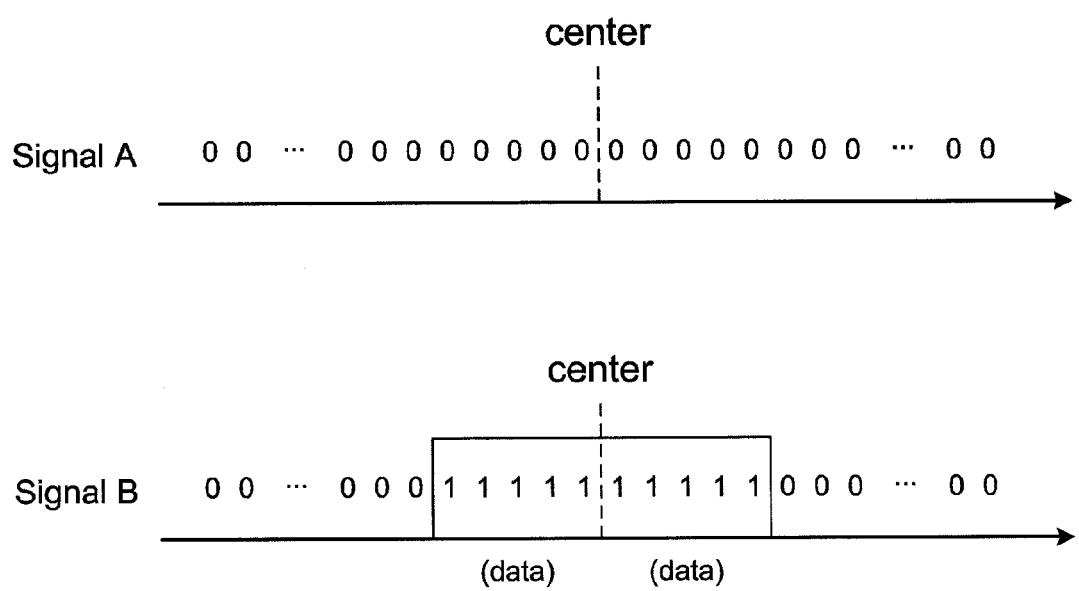

FIG. 5b illustrates a graph wherein a case where the pulse width of the data signal included in the frame of the PWM signal is six, i.e., [data]=6, and the amplitude thereof is −1. Referring to FIG. 5b, since [data] is greater than [MPC] (=5), the controller 110 outputs zero as the signal A and the data signal as the signal B.

Figure 5C:
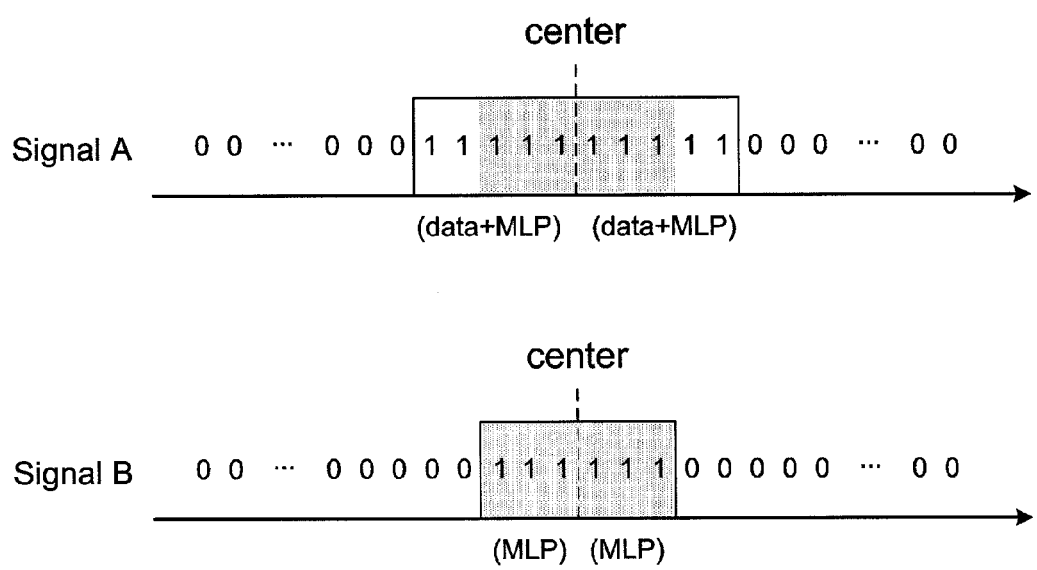

FIG. 5c illustrates a graph wherein a case where the pulse width of the data signal included in the frame of the PWM signal is two, i.e., [data]=2, and the amplitude thereof is +1. Referring to FIG. 5c, since [data] is equal to or less than [MLP] (=3), the controller 110 outputs the compensating signal as the signal A having a pulse width of [data]+[MLP] and outputs the MLP signal as the signal B.

That is, the compensating signal having the pulse width of 5 is outputted as the signal A and the MLP signal having the pulse width of 3 is outputted as the signal B. Since [the signal A−the signal B] is applied to the speaker 220, the signal applied to the speaker 220 is substantially same as the data signal.

Figure 5D:
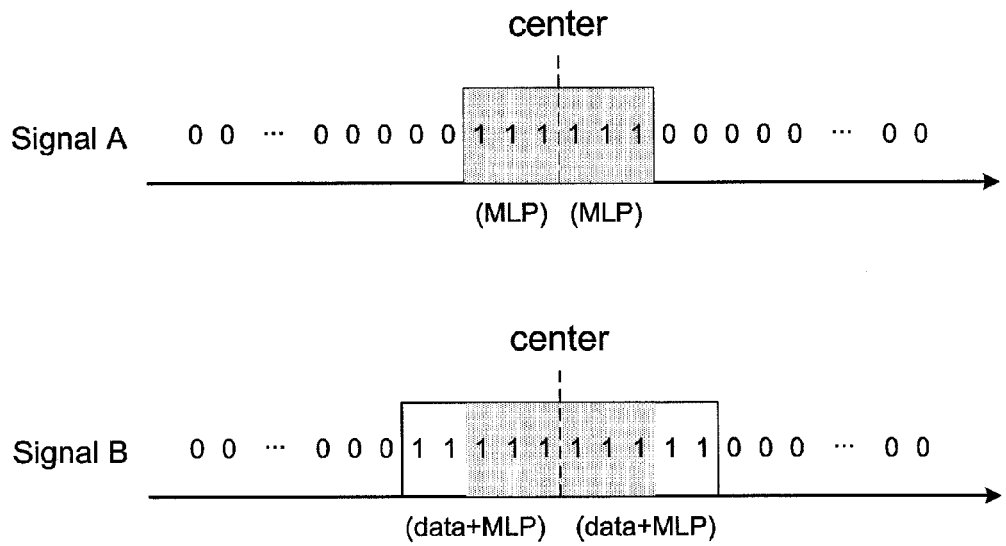

FIG. 5d illustrates a graph wherein a case where the pulse width of the data signal included in the frame of the PWM signal is two, i.e., [data]=2, and the amplitude thereof is Referring to FIG. 5d, since [data] is equal to or less than [MLP] (=5), the controller 110 outputs the MLP signal as the signal A and outputs the compensating signal as the signal B having the pulse width of [data]+[MLP].

That is, the MLP signal having the pulse width of 3 is outputted as the signal A and the compensating signal having the pulse width of 5 is outputted as the signal B. Since [the signal A−the signal B] is applied to the speaker 220, the signal applied to the speaker 220 is substantially same as the data signal.

As shown in FIGS. 5a through 5d, when [data] is greater than [MPC], the controller 110 outputs the data signal, and when [data] is equal to or less than [MPC], the controller 110 outputs the MLP signal and the compensating signal wherein the pulse width of the compensating signal is [data]+[MLP], to drive the switch module 120.

FIGS. 6a through 6d are graphs exemplifying the data signal, the MLP signal and compensating signals in accordance with a second embodiment of the present invention, where [MLP]=3 and [MPC]=5.

Figure 6A:
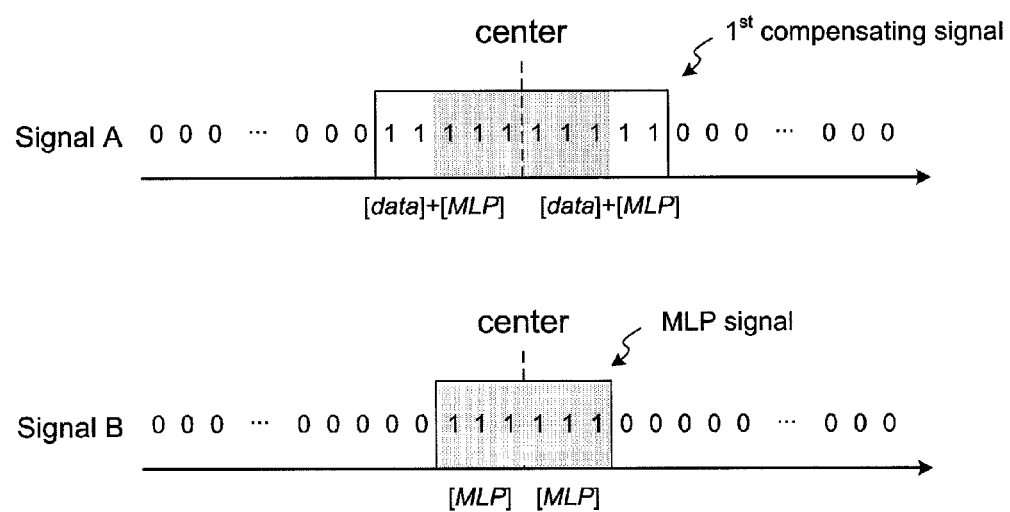
FIGS. 6a through 6d are graphs exemplifying a data signal, an MLP signal and compensating signals in accordance with a second embodiment of the present invention.

FIG. 6a illustrates a graph wherein a case where the pulse width of the data signal included in the frame of the PWM signal is two, i.e., [data]=2, and the amplitude thereof is +1. Referring to FIG. 6a, since [data] is equal to or less than [MPC] (=5), the controller 110 outputs the first compensating signal as the signal A having the pulse width of [data]+[MLP], and outputs the MLP signal as the signal B.

That is, the first compensating signal having the pulse width of 5 is outputted as the signal A, and the MLP signal having the pulse width of 3 is outputted as the signal B. Since [the signal A−the signal B] is applied to the speaker 220, the signal applied to the speaker 220 is substantially same as the data signal.

Figure 6B:
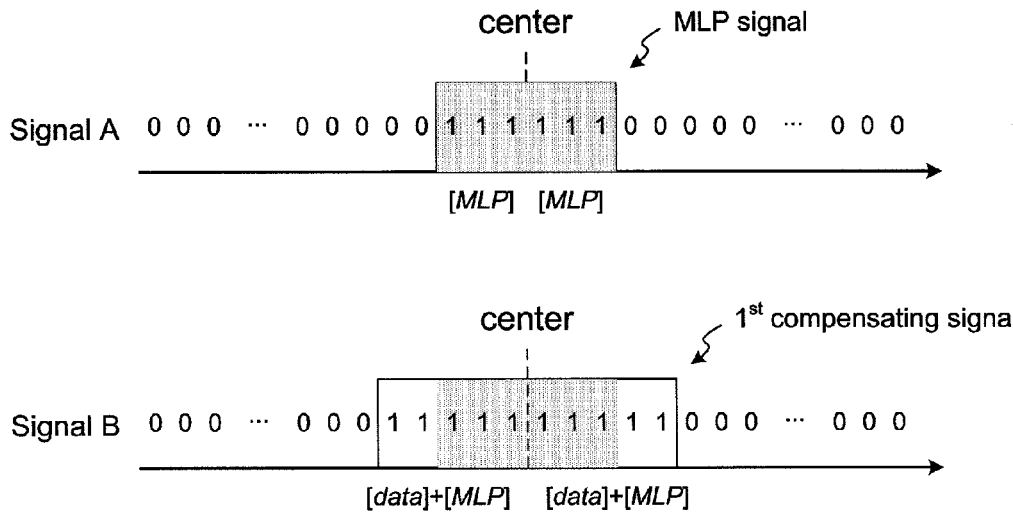

FIG. 6b illustrates a graph wherein a case where the pulse width of the data signal included in the frame of the PWM signal is two, i.e., [data]=2, and the amplitude thereof is −1. Referring to FIG. 6b, since [data] is equal to or less than [MPC] (=5), the controller 110 outputs the MLP signal as the signal A and outputs the first compensating signal as the signal B having the pulse width of [data]+[MLP].

That is, the MLP signal having the pulse width of 3 is outputted as the signal A and the first compensating signal having the pulse width of 5 is outputted as the signal B. Since [the signal A−the signal B] is applied to the speaker 220, the signal applied to the speaker 220 is substantially same as the data signal.

Figure 6C:
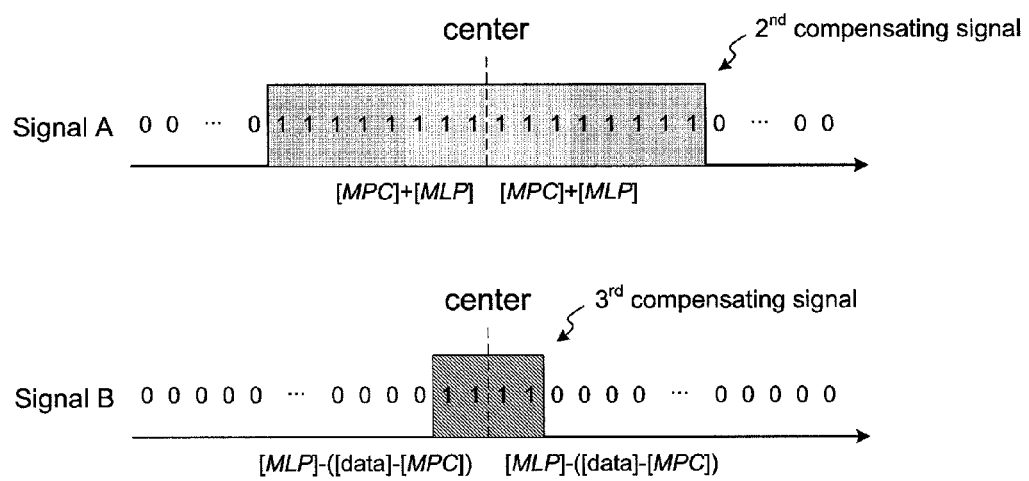

FIG. 6c illustrates a graph wherein a case where the pulse width of the data signal included in the frame of the PWM signal is six, i.e., [data]=6, and the amplitude thereof is +1. Referring to FIG. 6c, since [data] is greater than [MPC] but equal to or less than [MPC]+[MLP] (=8), the controller 110 outputs the second compensating signal as the signal A having the pulse width of [MPC]+[MLP] (=8) and outputs the third compensating signal as the signal B having the pulse width of [MLP]−([data]−[MPC]) (=2).

Since [the signal A−the signal B] is applied to the speaker 220, the signal applied to the speaker 220 is substantially same as the data signal.

Figure 6D:
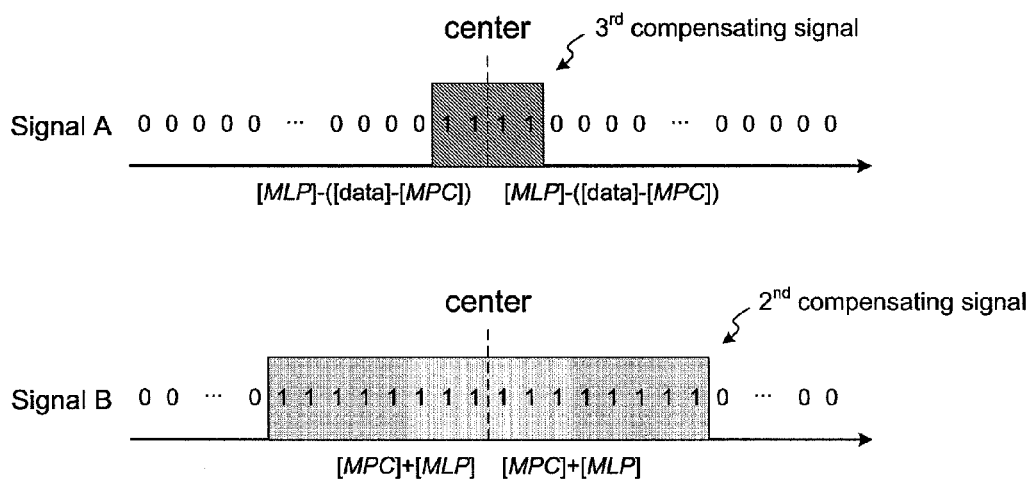

FIG. 6d illustrates a graph wherein a case where the pulse width of the data signal included in the frame of the PWM signal is six, i.e., [data]=6, and the amplitude thereof is −1. Referring to FIG. 6d, since [data] is greater than [MPC] but equal to or less than [MPC]+[MLP], the controller 110 outputs the third compensating signal as the signal A having the pulse width of [MLP]−([data]−[MPC]) (=2) and outputs the second compensating signal as the signal B having the pulse width of [MPC]+[MLP] (=8).

Since [the signal A−the signal B] is applied to the speaker 220, the signal applied to the speaker 220 is substantially same as the data signal.

Figure 6E:
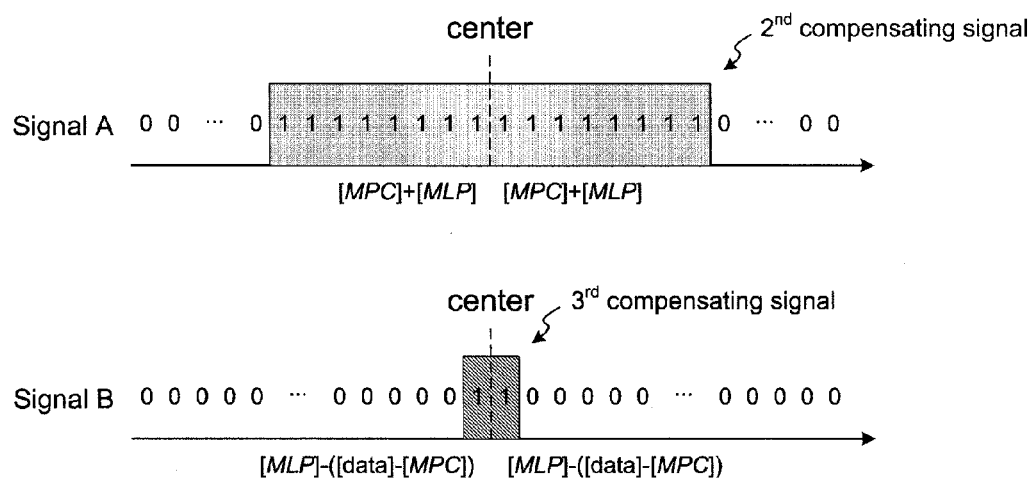

FIG. 6e illustrates a graph wherein a case where the pulse width of the data signal included in the frame of the PWM signal is seven, i.e., [data]=7, and the amplitude thereof is +1. Referring to FIG. 6e, since [data] is greater than [MPC] but equal to or less than [MPC]+[MLP] (=8), the controller 110 outputs the second compensating signal as the signal A having the pulse width of [MPC]+[MLP] (=8) and outputs the third compensating signal as the signal B having the pulse width of [MLP]−([data]−[MPC]) (=1).

Since [the signal A−the signal B] is applied to the speaker 220, the signal applied to the speaker 220 is substantially same as the data signal.

Figure 6F:
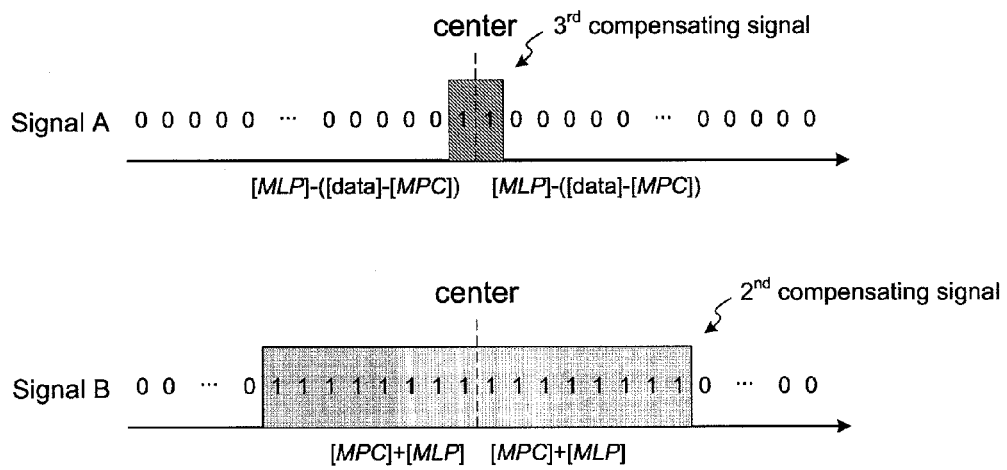

FIG. 6f illustrates a graph wherein a case where the pulse width of the data signal included in the frame of the PWM signal is seven, i.e., [data]=7, and the amplitude thereof is −1. Referring to FIG. 6f, since [data] is greater than [MPC] but equal to or less than [MPC]+[MLP] (=8), the controller 110 outputs the third compensating signal as the signal A having the pulse width of [MLP]−([data]−[MPC]) (=1) and outputs the second compensating signal as the signal B having the pulse width of [MPC]+[MLP] (=8).

Since [the signal A−the signal B] is applied to the speaker 220, the signal applied to the speaker 220 is substantially same as the data signal.

Figure 6G:
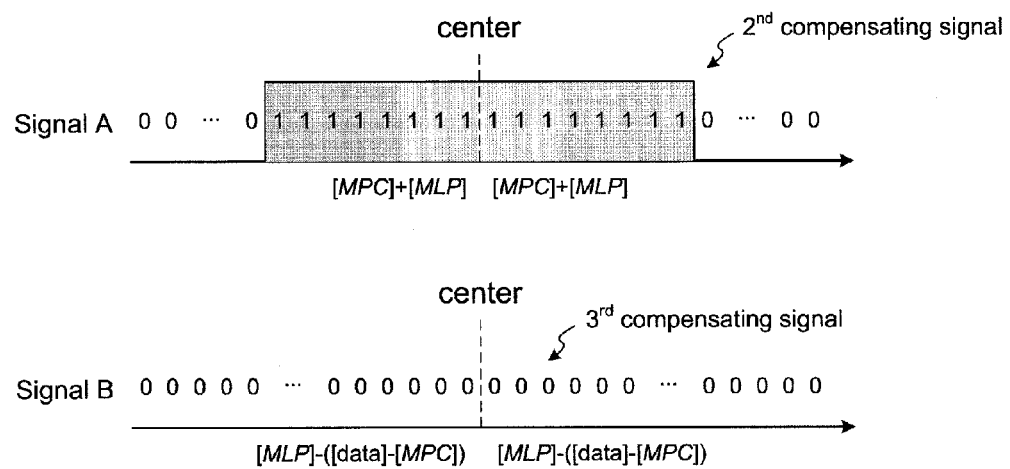

FIG. 6g illustrates a graph wherein a case where the pulse width of the data signal included in the frame of the PWM signal is eight, i.e., [data]=8, and the amplitude thereof is +1. Referring to FIG. 6g, since [data] is greater than [MPC] but equal to or less than [MPC]+[MLP] (=8), the controller 110 outputs the second compensating signal as the signal A having the pulse width of [MPC]+[MLP] (=8) and outputs the third compensating signal as the signal B having the pulse width of [MLP]−([data]−[MPC]) (=0).

Since [the signal A−the signal B] is applied to the speaker 220, the signal applied to the speaker 220 is substantially same as the data signal.

Figure 6H:
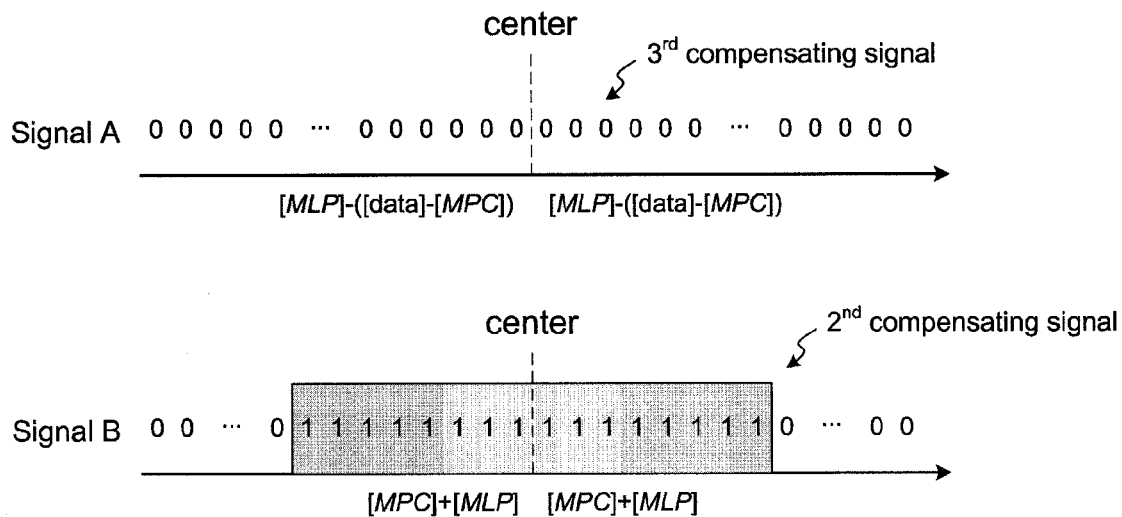

FIG. 6h illustrates a graph wherein a case where the pulse width of the data signal included in the frame of the PWM signal is eight, i.e., [data]=8, and the amplitude thereof is −1. Referring to FIG. 6h, since [data] is greater than [MPC] but equal to or less than [MPC]+[MLP] (=8), the controller 110 outputs the third compensating signal as the signal A having the pulse width of [MLP]−([data]−[MPC]) (=0) and outputs the second compensating signal as the signal B having the pulse width of [MPC]+[MLP] (=8).

Since [the signal A−the signal B] is applied to the speaker 220, the signal applied to the speaker 220 is substantially same as the data signal.

Figure 6I:
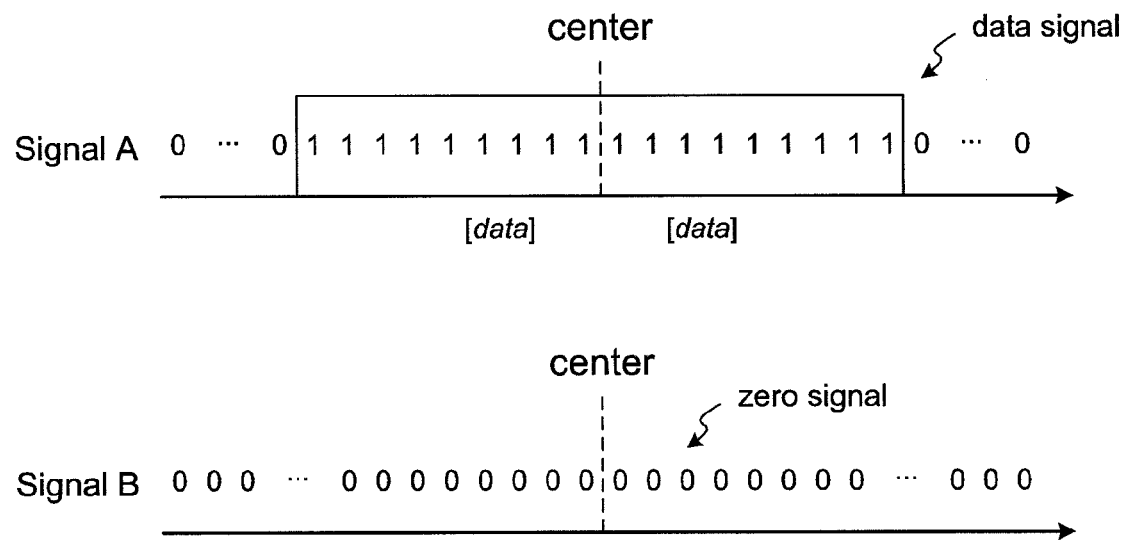

FIG. 6i illustrates a graph wherein a case where the pulse width of the data signal included in the frame of the PWM signal is nine, i.e., [data]=9, and the amplitude thereof is +1. Referring to FIG. 6i, since [data] is greater than [MPC]+[MLP], the controller 110 outputs the data signal as the signal A and zero as the signal B.

Figure 6J:
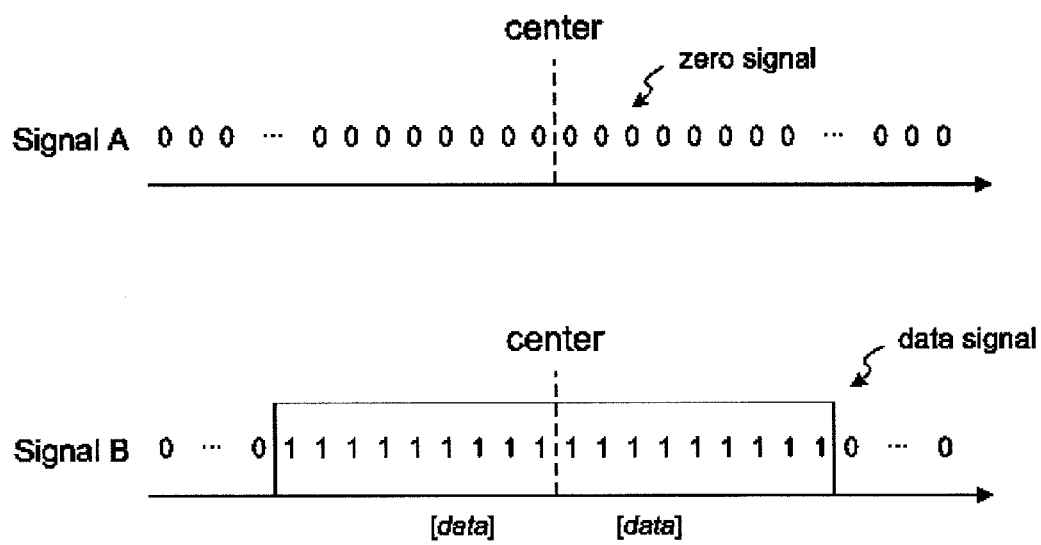

FIG. 6j illustrates a graph wherein a case where the pulse width of the data signal included in the frame of the PWM signal is nine, i.e., [data]=9, and the amplitude thereof is −1. Referring to FIG. 6j, since [data] is greater than [MPC]+[MLP] (=8), the controller 110 outputs zero as the signal A and the data signal as the signal B.

As shown in FIGS. 6a through 6j, when [data] is less than [MPC], the controller 110 outputs the MLP signal; and the first compensating signal wherein the pulse width of the first compensating signal is [data]+[MLP]. When [data] is greater than [MPC] but equal to or less than [data]+[MLP], the controller 110 outputs the second compensating signal wherein the pulse width of the second compensating signal is [MPC]+[MLP]; and the third compensating signal wherein the pulse width of the third compensating signal is [MLP]−([data]−[MPC]) to drive the switch module 120. That is, with respect to [MPC], the data signal is compensated for in the amount of [MLP] when [data]≦[MPC], and the data signal is compensated until [MLP]−([data]−[MPC]) is zero when [MPC]< [data] as increasing [data] increases. When [data]>[MPC]+ [MLP] is satisfied as [data] increases further, the data signal is outputted without compensation.

[MPC] may vary according to the PWM signal used. For instance, when a length of one frame is 128 clocks, ([MPC]+ [MLP])≦(128−[MPW]) must be satisfied. MPW is a minimum pulse width wherein a pulse width of a longest pulse included in the frame is 128 clocks when the length of one frame is 128 clocks, and MPW is 4, for example. Therefore, ([MPC]+[MLP])≦124 is satisfied, when [MLP]=3 is satisfied, and [MPC] may be selected from a value smaller than 121 clocks.

Figure 7A:
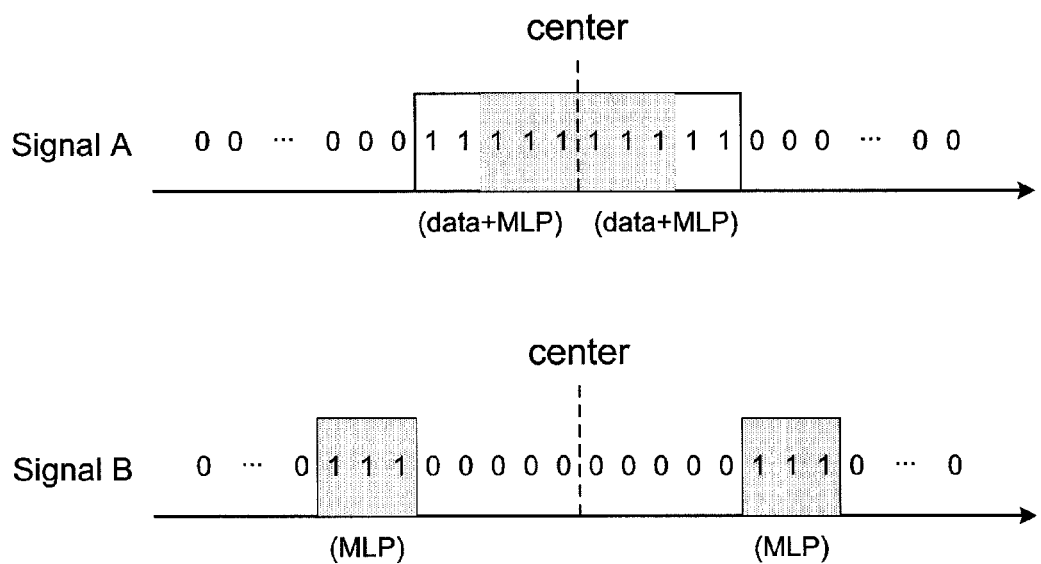
FIGS. 7a through 7c are graphs exemplifying a data signal, an MLP signal and a compensating signal in accordance with a third embodiment of the present invention.
Figure 7B:
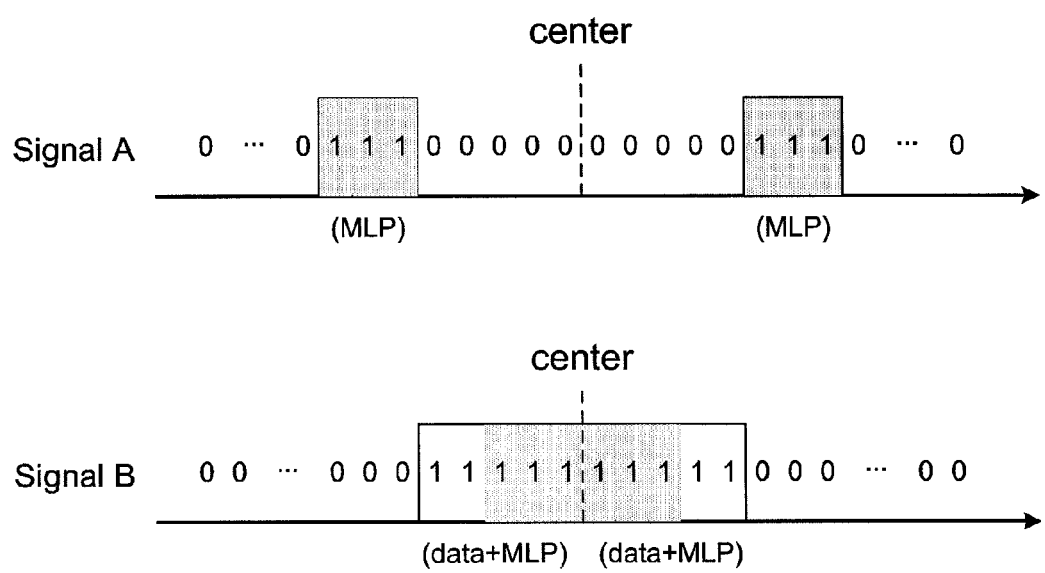
Figure 7C:
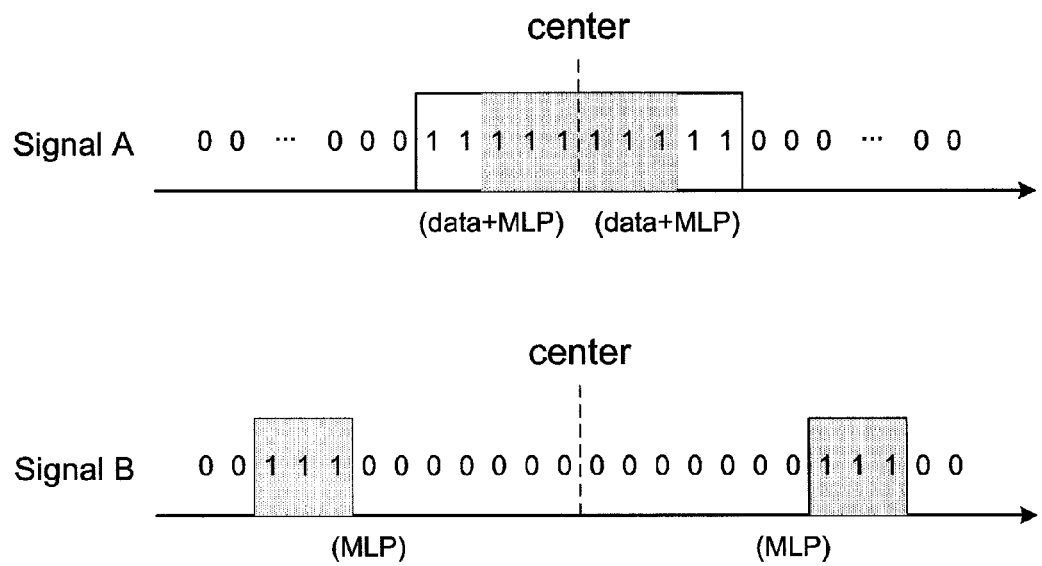

FIGS. 7a through 7c are graphs exemplifying the data signal, the MLP signal and the compensating signal in accordance with a third embodiment of the present invention, where [MLP]=3 and [MPC]=5.

In accordance with the third embodiment of the present invention, when [data] is greater than [MPC], the controller 110 outputs the signals same as the signal A and the signal B shown in FIGS. 5a and 5b.

When [data] is equal to or less than [MPC], the controller 110 outputs the signals same as the signal A and the signal B shown in FIGS. 7a through 7c.

FIG. 7a illustrates a graph wherein a case where the pulse width of the data signal included in the frame of the PWM signal is two, i.e., [data]=2, and the amplitude thereof is +1. Referring to FIG. 7a, since [data] is equal to or less than [MPC] (=5), the controller 110 outputs the compensating signal as the signal A having the pulse width of [data]+[MLP] and the MLP signal as the signal B.

That is, the compensating signal having the pulse width of 5 is outputted as the signal A and the MLP signal having the pulse width of 3 is outputted as the signal B. Since [the signal A−the signal B] is applied to the speaker 220, the signal applied to the speaker 220 is substantially same as the data signal.

While the MLP signal and the compensating signal shown in FIG. 5c overlap with each other with respect to a time axis, the MLP signal and the compensating signal shown in FIG. 7a do not overlap with each other with respect to the time axis. Particularly, an interval between the MLP signal and the compensating signal shown in 7a is zero. That is, the MLP signal is adjacent to the compensating signal.

FIG. 7b illustrates a graph wherein a case where the pulse width of the data signal included in the frame of the PWM signal is two, i.e., [data]=2, and the amplitude thereof is −1. Referring to FIG. 7b, since [data] is equal to or less than [MPC] (=5), the controller 110 outputs the MLP signal as the signal A and outputs the compensating signal as the signal B having the pulse width of [data]+[MLP].

That is, the MLP signal having the pulse width of 3 is outputted as the signal A and the compensating signal having the pulse width of 5 is outputted as the signal B. Since [the signal A−the signal B] is applied to the speaker 220, the signal applied to the speaker 220 is substantially same as the data signal.

While the MLP signal and the compensating signal shown in FIG. 5d overlap with each other with respect to the time axis, the MLP signal and the compensating signal shown in FIG. 7b do not overlap with each other with respect to the time axis. Particularly, the interval between the MLP signal and compensating signal shown in FIG. 7b is zero. That is, the MLP signal is adjacent to the compensating signal.

FIG. 7c illustrates a graph wherein a case where the pulse width of the data signal included in the frame of the PWM signal is two, i.e., [data]=2, and the amplitude thereof is +1. Referring to FIG. 7c, since [data] is equal to or less than [MPC] (=5), the controller 110 outputs the compensating signal as the signal A having the pulse width of [data]+[MLP] and the MLP signal as the signal B.

That is, the compensating signal having the pulse width of 5 is outputted as the signal A and the MLP signal having the pulse width of 3 is outputted as the signal B. Since [the signal A−the signal B] is applied to the speaker 220, the signal applied to the speaker 220 is substantially same as the data signal.

The MLP signal and the compensating signal shown in FIG. 7c do not overlap with each other and the interval between the MLP signal and the compensating signal is also non-zero. That is, the MLP signal is outputted in a manner that a predetermined time gap exists before and after the compensating signal with respect to the time axis between the MLP signal and the compensating signal.

Figure 8A:
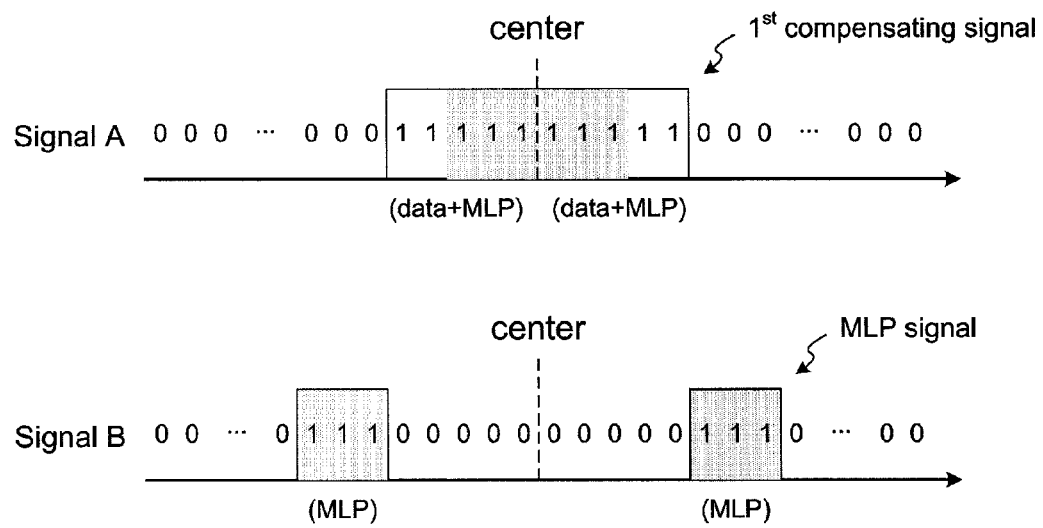
FIGS. 8a through 8c are graphs exemplifying a data signal, an MLP signal and compensating signals in accordance with a fourth embodiment of the present invention.
Figure 8B:
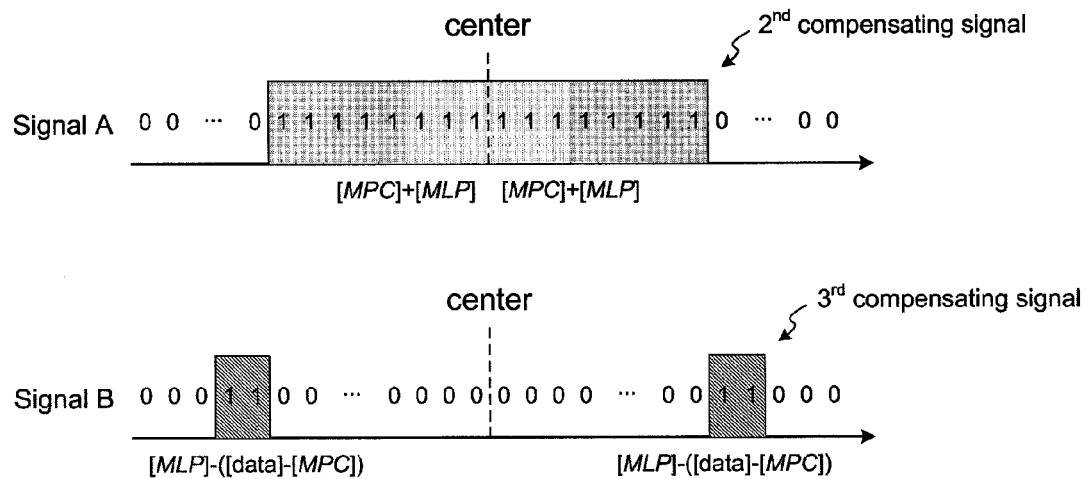
Figure 8C:
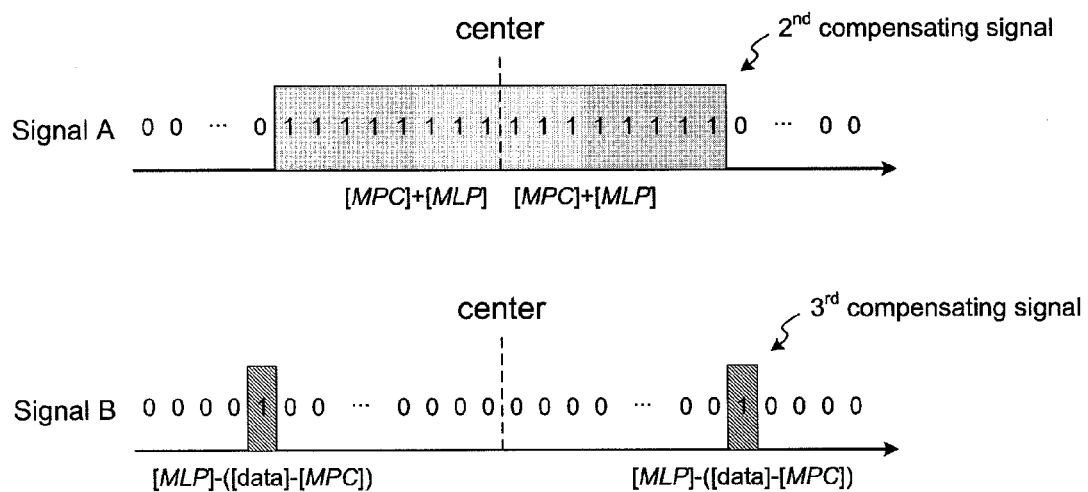

FIGS. 8a through 8c are graphs exemplifying the data signal, the MLP signal and compensating signals in accordance with a fourth embodiment of the present invention, where [MLP]=3 and [MPC]=5.

The fourth embodiment shown in FIG. 8a differs from the second embodiment shown in FIG. 6a in that the MLP signal and the first compensating signal do not overlap with each other. Even when the MLP signal and the first compensating signal do not overlap with each other, the signal applied to the speaker 220 is substantially same as the data signal because [the signal A−the signal B] is applied to the speaker 220. Therefore, in view of the signal applied to the speaker 220, the fourth embodiment shown in FIG. 8a is substantially same as the second embodiment shown in FIG. 6a.

Particularly, an interval between the MLP signal and the first compensating signal shown in FIG. 8a is zero. That is, the MLP signal is adjacent to the compensating signal. However, it is not necessary for the MLP signal to be adjacent to the first compensating signal, and it is sufficient if the MLP signal and the compensating signal are located within the same frame.

Similar to the fourth embodiment shown in FIG. 8a, the MLP signal and the first compensating signal of the second embodiment shown in FIG. 6b do not overlap with each other.

The fourth embodiment shown in FIG. 8b differs from the second embodiment shown in FIG. 6c is that the first compensating signal and the second compensating signal do not overlap with each other. Even when the first compensating signal and the second compensating signal do not overlap with each other, the signal applied to the speaker 220 is substantially same as the data signal because [the signal A−the signal B] is applied to the speaker 220.

Particularly, the interval between the first compensating signal and the second compensating signal shown in FIG. 8b is zero. That is, the first compensating signal is adjacent to the second compensating signal. However, it is not necessary for the first compensating signal to be adjacent to the second compensating signal, and it is sufficient if the first compensating signal and the second compensating signal are located within the same frame.

Similar to the fourth embodiment shown in FIG. 8b, the first compensating signal and the second compensating signal of the second embodiment shown in FIG. 6d do not overlap with each other.

The fourth embodiment shown in FIG. 8c differs from the second embodiment shown in FIG. 6e in that the first compensating signal and the second compensating signal do not overlap with each other. Even when the first compensating signal and the second compensating signal do not overlap with each other, the signal applied to the speaker 220 is substantially same as the data signal because [the signal A−the signal B] is applied to the speaker 220. Therefore, in view of the signal applied to the speaker 220, the fourth embodiment shown in FIG. 8c is substantially same as the second embodiment shown in FIG. 6e.

Particularly, the interval between the first compensating signal and the second compensating signal shown in FIG. 8c is zero. That is, the first compensating signal is adjacent to the second compensating signal. However, it is not necessary for the first compensating signal to be adjacent to the second compensating signal, and it is sufficient if the first compensating signal and the second compensating signal are located within the same frame.

Similar to the fourth embodiment shown in FIG. 8c, the first compensating signal and the second compensating signal of the second embodiment shown in FIG. 6f do not overlap with each other.

When the MLP signal is located at both sides of the compensating signal without overlapping with each other similar to the third embodiment shown in FIGS. 7a through 7c and the fourth embodiment shown in FIGS. 8a through 8c, a problem due to a common mode wherein both of the signal A and the signal B is +1 may be prevented.

Figure 9:
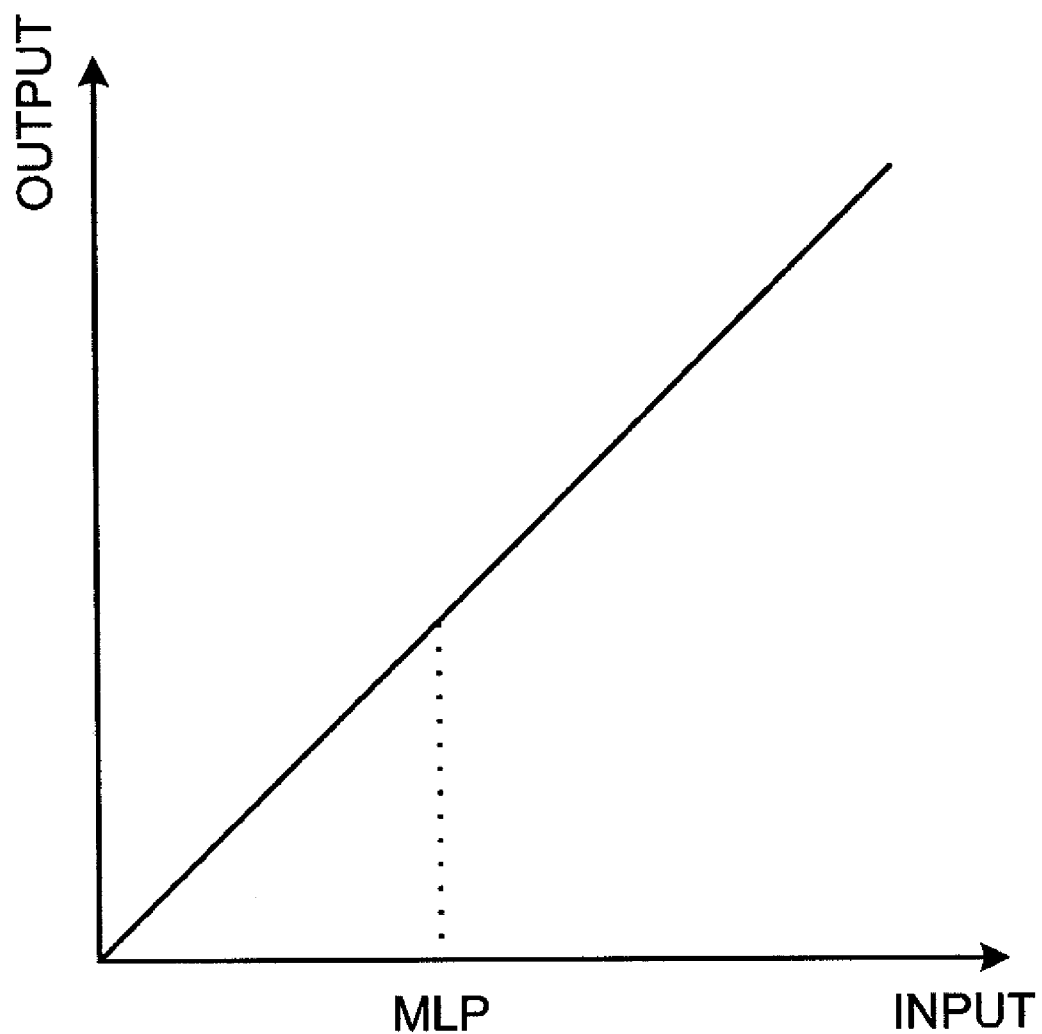
FIG. 9 is a graph exemplifying a relationship between pulse widths of an input signal and an output signal in accordance with the present invention.

FIG. 9 is a graph exemplifying a relationship between pulse widths of an input signal and an output signal in accordance with the present invention.

As shown in FIG. 9, the linearity between the pulse widths of the input signal and the output signal is maintained even when the input pulse is less than [MLP].

Figure 10:
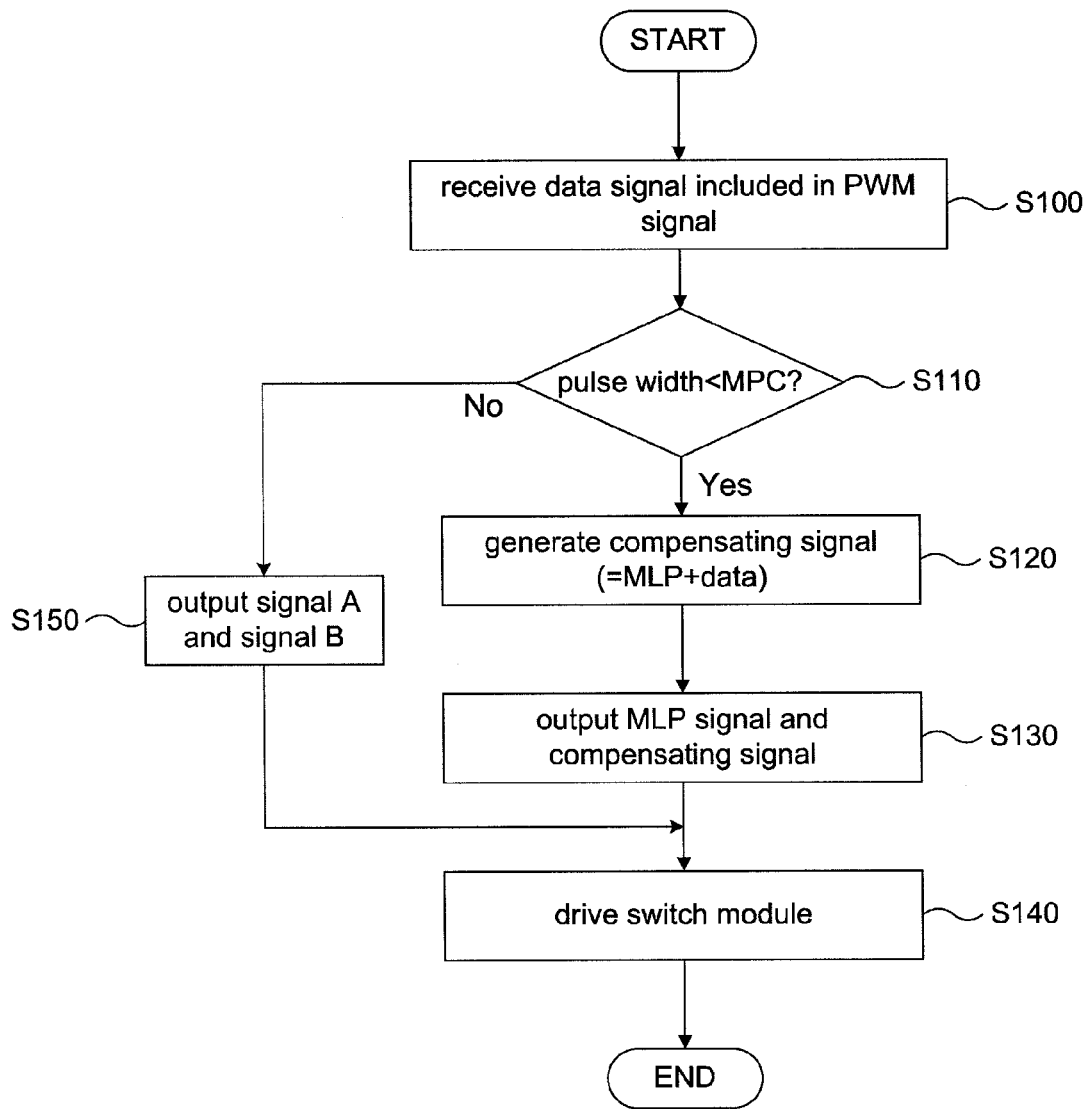
FIG. 10 is a flow diagram illustrating a method for controlling a switching device in accordance with the first embodiment of the present invention.

FIG. 10 is a flow diagram illustrating a method for controlling the switching device in accordance with the first embodiment of the present invention.

Referring to FIG. 10, the data signal included in the frame of the PWM signal transmitted by the PWM converter is received (S100).

Thereafter, whether [data]≦[MPC] is satisfied is determined (S110).

When [data]>[MPC] is satisfied, the controller outputs the signal A and the signal B shown in FIGS. 5a and 5b (S150). Since the signal A and the signal B outputted in the step S150 are described above with reference to FIGS. 5a and 5b, detailed descriptions of the signal A and the signal B are omitted.

When [data]≦[MPC] is satisfied, the controller generates and outputs the MLP signal and the compensating signal shown in FIGS. 5c, 5d and 7a through 7c (S120 and S130). The compensating signal has the pulse width of [data]+

[MLP]. The MLP signal and the compensating signal outputted in the step S130 are described above with reference to FIGS. 5c, 5d and 7a through 7c, detailed descriptions of the MLP signal and the compensating signal are omitted.

Thereafter, the switch module is driven by the output signal of the controller (S140). The output signal of the switch module is passed through a low-pass filter to be driven a speaker.

Figure 11:
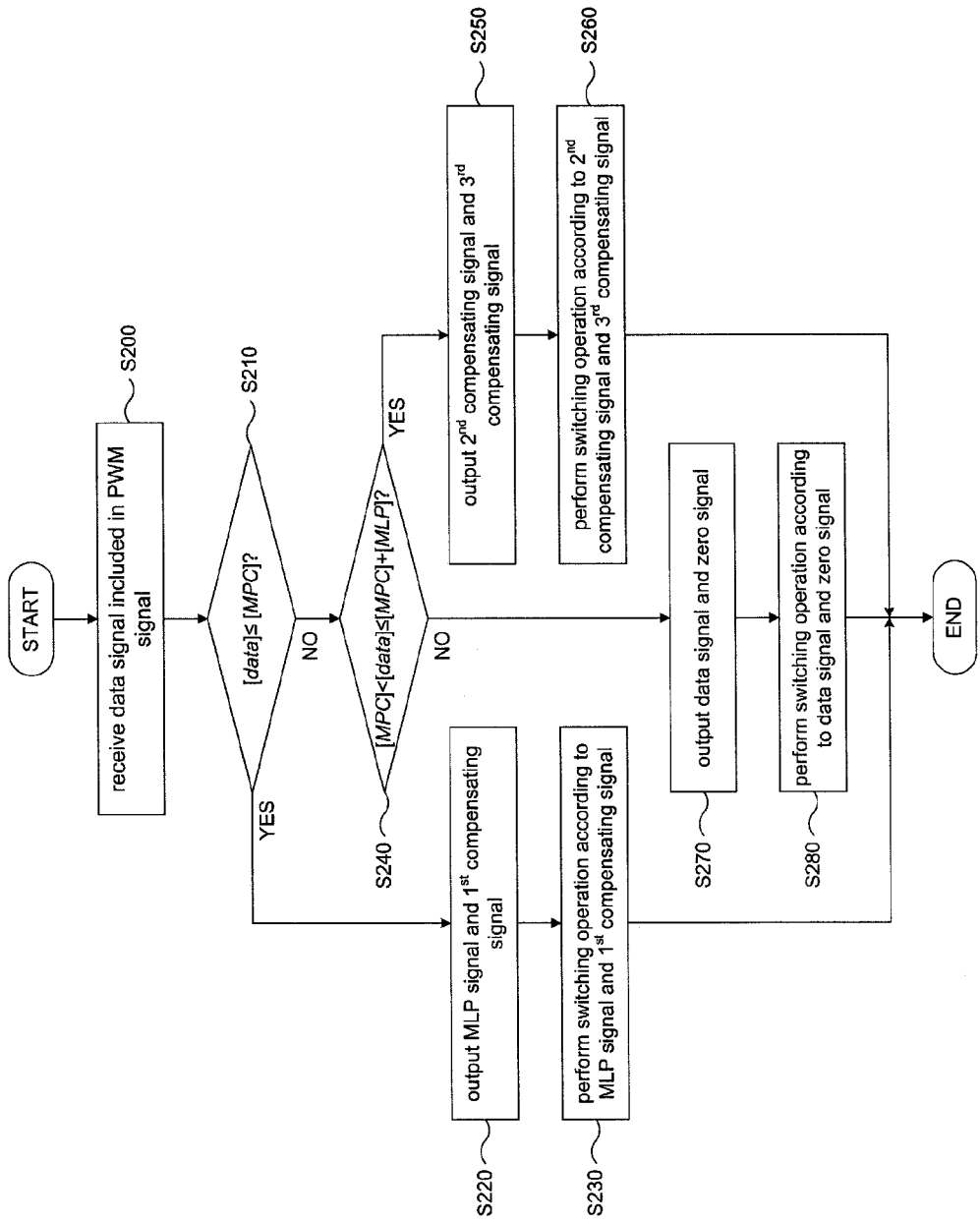
FIG. 11 is a flow diagram illustrating a method for controlling a switching device in accordance with the second embodiment of the present invention.

FIG. 11 is a flow diagram illustrating a method for controlling the switching device in accordance with the second embodiment of the present invention.

Referring to FIG. 11, the data signal included in the frame of the PWM signal transmitted by the PWM converter is received (S200).

Thereafter, whether [data]≦[MPC] is satisfied is determined (S210).

When [data]≦[MPC] is satisfied, the MLP signal and the first compensating signal having the pulse width of [data]+[MLP] are outputted (S220). That is, the controller outputs the signal A and the signal B shown in FIGS. 6a and 6b. Since the signal A and the signal B outputted in the step S220 are described above with reference to FIGS. 6a and 6b, detailed descriptions of the signal A and the signal B are omitted.

Thereafter, the switching module performs the switching operating according to the MLP signal and the first compensating signal outputted in the step S220 (S230).

When [data]≦[MPC] is not satisfied, whether [MPC]<[data]≦[MPC]+[MLP] is satisfied is determined (S240).

When [MPC]<[data]≦[MPC]+[MLP] is satisfied, the second compensating signal having the pulse width of [MPC]+[MLP] and the third compensating signal having the pulse width of [MLP]−([data]−[MPC]) are outputted (S250). That is, the controller outputs the signal A and the signal B shown in FIGS. 6c through 6h. Since the signal A and the signal B outputted in the step S250 are described above with reference to FIGS. 6c through 6h, detailed descriptions of the signal A and the signal B are omitted.

Thereafter, the switching module performs the switching operating according to the second compensating signal and the third compensating signal outputted in the step S250 (S260).

When [MPC]<[data]≦[MPC]+[MLP] is not satisfied, i.e., satisfying [data]>[MPC]+[MLP], the data signal and a signal having the pulse width of zero are outputted (S270). That is, the controller outputs the signal A and the signal B shown in FIGS. 6i through 6j. Since the signal A and the signal B outputted in the step S270 are described above with reference to FIGS. 6i through 6j, detailed descriptions of the signal A and the signal B are omitted.

Thereafter, the switching module performs the switching operating according to the data signal and the signal having the pulse width of zero (S280).

The switching device of the digital amplifier and the method for controlling the same in accordance with the present invention has following advantages.

In accordance with the present invention, the linearity is maintain even for the short pulse width since the data signal having the pulse width shorter than a predetermined length. Therefore, the distortion occurring during the driving of the speaker is prevented.

Particularly, when the MLP signal is located at both sides of the compensating signal without overlapping with each other, the problem due to the common mode may be prevented thereby improving a characteristic of the digital amplifier.

While the present invention has been particularly shown and described with reference to the preferred embodiment thereof, it will be understood by those skilled in the art that various changes in form and details may be effected therein without departing from the spirit and scope of the invention as defined by the appended claims.

What is claimed is:

1. A switching device for driving a load according to a data signal included in a frame of a PWM signal, comprising:
    a controller for outputting an MLP signal; and a first compensating signal when [data]≦[MPC] is satisfied, wherein a pulse width of the first compensating signal is sum of [data] and [MLP], a second compensating signal; and a third compensation signal when [MPC]<[data]≦([MPC]+[MLP]) is satisfied, wherein a pulse width of the second compensation signal is a sum of [MPC] and [MLP], and a pulse width of the third compensation is [MLP]−([data]−[MPC]); and
    a switch module for performing a switching operation according to the MLP signal, the first compensating signal, the second compensating signal and the third compensating signal (where [MPC] is a reference pulse width, [data] and [MLP] are pulse widths of the data signal and the MLP signal, respectively).

2. The device in accordance with claim 1, wherein [MPC] satisfies [MLP]+[MPC]≦(a length of the frame−[MPW]) (where [MPW] is a minimum pulse width).

3. The device in accordance with claim 1, wherein the MLP signal, each of the first compensating signal, the second compensating signal and the third compensating signal is located within the frame, and overlaps with each other with respect to a time axis.

4. The device in accordance with claim 1, wherein each of the first compensating signal, the second compensating signal and the third compensating signal is located within the frame, and not overlapping with each other with respect to a time axis.

5. The device in accordance with claim 4, wherein intervals between the MLP signal and the first compensating signal, and the second compensating signal and the third compensation signal are zero, respectively.

6. The device in accordance with claim 4, wherein intervals between the MLP signal and the first compensating signal, and the second compensating signal and the third compensation signal are non-zero, respectively.

7. The device in accordance with claim 4, wherein the MLP signal is located before and after the first compensating signal with each other with respect to the time axis.

8. A method for driving a switching device driving a load according to a data signal included in a frame of a PWM signal, the method comprising steps of:
    (a) determining whether [data]≦[MPC] is satisfied;
    (b) outputting an MLP signal; and a first compensating signal when [data]≦[MPC] is satisfied, wherein a pulse width of the first compensating signal is sum of [data] and [MLP];
    (c) performing a switching operation according to the MLP signal and the compensating signal outputted in the step (b);
    (d) determining whether [MPC]<[data]≦[MPC]+[MLP] is satisfied;
    (e) outputting a second compensating signal; and a third compensating signal when [MPC]<[data]≦[MPC]+[MLP] is satisfied, wherein a pulse width of the second compensating signal is sum of [MPC] and [MLP], and a pulse width of the third compensating signal is [MLP]−([data]−[MPC]); and
    (f) performing the switching operation according to the second compensating signal and the third compensating signal outputted in the step (e) (where [MPC] is a reference pulse width, [data] and [MLP] are pulse widths of the data signal and the MLP signal, respectively).

9. The method in accordance with claim 8, wherein [MPC] satisfies ([MLP]+[MPC])≦(a length of the frame−[MPW]) (where [MPW] is minimum pulse width).

10. The method in accordance with claim 8, wherein each of the MLP signal, the first compensating signal, the second compensating signal and the third compensating signal is located within the frame, and overlaps with each other with respect to a time axis.

11. The method in accordance with claim 8, wherein each of the first compensating signal, the second compensating signal and the third compensating signal is located within the frame, and not overlapping with each other with respect to a time axis.

12. The method in accordance with claim 11, wherein intervals between the MLP signal and the first compensating signal and the second compensating signal and the third compensation signal are zero, respectively.

13. The method in accordance with claim 11, wherein intervals between the MLP signal and the first compensating signal and the second compensating signal and the third compensation signal are non-zero, respectively.

14. The method in accordance with claim 11, wherein the MLP signal is located before and after the first compensating signal with each other with respect to the time axis.

* * * * *